United States Patent [19]

Kern

[11] Patent Number: 4,546,016
[45] Date of Patent: Oct. 8, 1985

[54] DEPOSITION OF BOROPHOSPHOSILICATE GLASS

[75] Inventor: Werner Kern, Mercer County, N.J.
[73] Assignee: RCA Corporation, Princeton, N.J.
[21] Appl. No.: 636,832
[22] Filed: Aug. 6, 1984
[51] Int. Cl.[4] .................. C23C 11/00; C23C 13/00
[52] U.S. Cl. .................. 427/255.3; 427/93; 427/95; 427/255
[58] Field of Search .................. 427/255, 255.3, 95, 427/93

[56] References Cited

U.S. PATENT DOCUMENTS

| | | | |
|---|---|---|---|
| 3,481,781 | 12/1969 | Kern. | |
| 4,349,584 | 9/1982 | Flatley et al. | 427/93 |
| 4,363,830 | 12/1982 | Hsu et al. | 427/88 |
| 4,433,008 | 2/1984 | Schnable et al. | 427/95 |

OTHER PUBLICATIONS

Article—Chemically Vapor-Deposited Borophosphosilicate Glasses for Silicon Device Applications RCA Review, vol. 43, pp. 423–457.

Primary Examiner—Sadie L. Childs
Attorney, Agent, or Firm—Birgit E. Morris; R. Hain Swope

[57] ABSTRACT

An improved method of depositing borophosphosilicate glass (BPSG) on a substrate is disclosed. The improved method uses temperatures substantially lower than conventional and a volume ratio of oxygen to the total hydride content in the deposition mixture substantially higher than conventional. A BPSG film of increased purity is produced at a rate of deposition substantially faster than conventional procedures.

7 Claims, 1 Drawing Figure

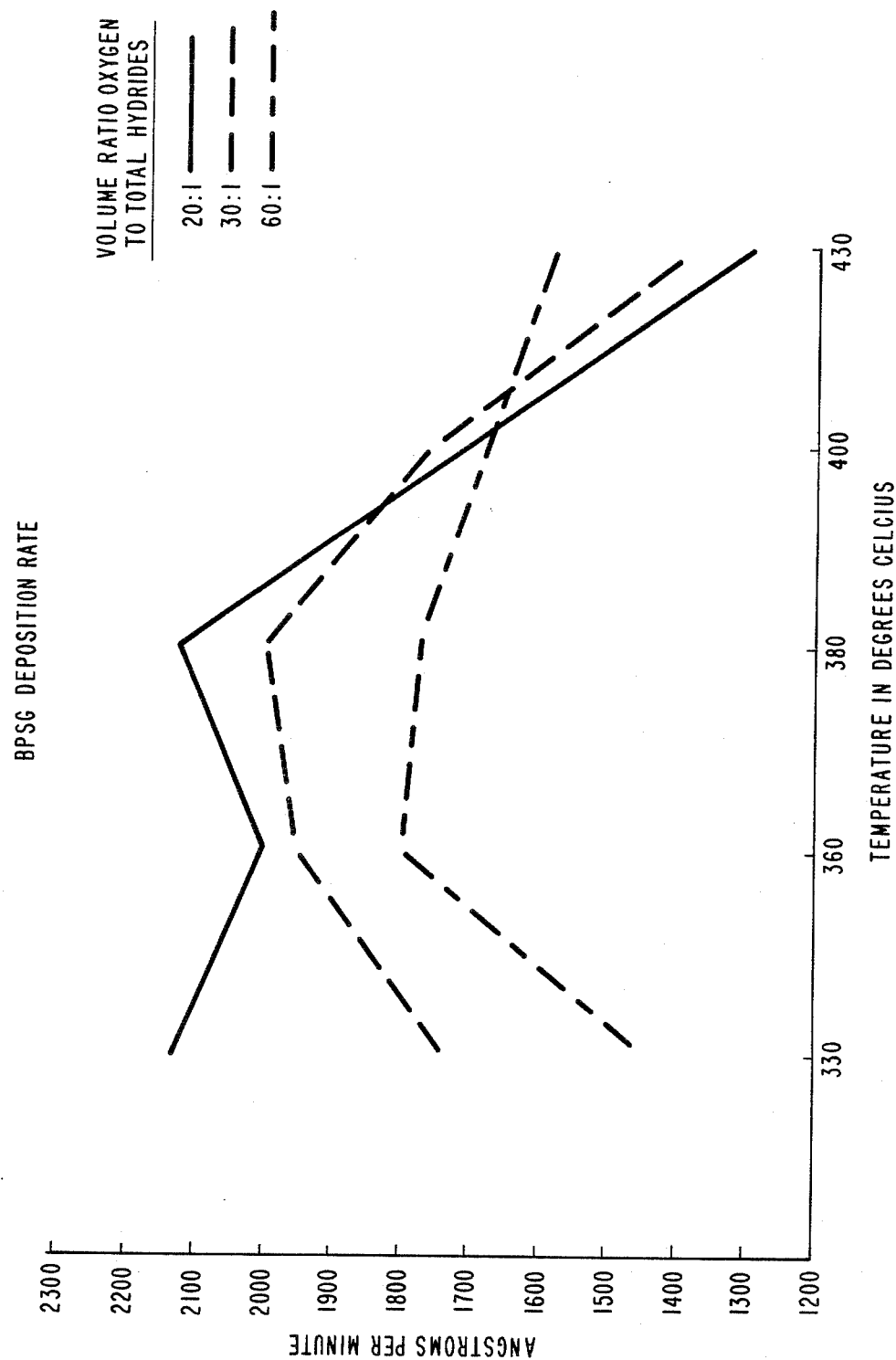

DEPOSITION OF BOROPHOSPHOSILICATE GLASS

This invention relates to improvements in the deposition of borophosphosilicate glass for electronic device application.

BACKGROUND OF THE INVENTION

Multilayer metallization structures are becoming commonplace in the electronics industry. In such systems, a first metal layer is deposited on a suitable substrate and defined. A layer of insulating dielectric material is deposited thereover and vias are formed therein to expose a portion of the first-level metal, or the substrate. The second metal layer is deposited thereover and defined to form the remaining portion of the interconnection system. The use of borophosphosilicate glass as the dielectric material in such a structure is disclosed by Schnable and Kern in copending application Ser. No. 641,410, filed Aug. 16, 1984.

Borophosphosilicate glass (BPSG) layers and their use in the semiconductor arts are disclosed by Kern in U.S. Pat. No. 3,481,781, issued Dec. 2, 1969. The use of BPSG to form tapered openings in glass coatings in semiconductor devices is disclosed by Flatley et al. in U.S. Pat. No. 4,349,584, issued Sept. 14, 1982 and Hsu et al. in U.S. Pat. No. 4,363,830, issued Dec. 14, 1982. Such applications take advantage of the superior reflow characteristics of BPSG. In such applications, a BPSG layer is deposited over a structure and heated to fusion taper it for better coverage of topography. Vias are opened in the BPSG layer and one or more underlying layers. The structure is then heated to a temperature at which the BPSG will soften and reflow at the edges of the vias, thus producing excellently tapered vias.

BPSG layers are conventionally deposited by chemical vapor deposition (CVD). In accordance with this invention, improvements in this technique have been found which significantly improve both the deposition rate of the BPSG layer and its quality.

SUMMARY OF THE INVENTION

Borophosphosilicate glass is deposited on a suitable structure by chemical vapor deposition at a temperature of from about 360° to about 390°.

BRIEF DESCRIPTION OF THE DRAWING

The FIGURE is a graph of the deposition rate of BPSG as a function of temperature.

DETAILED DESCRIPTION OF THE INVENTION

Chemical vapor deposition (CVD) of borophosphosilicate glass (BPSG) is carried out by gas phase oxidation of a mixture of the hydrides of silicon, boron and phosphorus, i.e. silane ($SiH_4$), phosphine ($PH_3$) and diborane ($B_2H_6$), with a suitable inert diluent, typically nitrogen. Although other gases such as nitric oxide, nitrous oxide and carbon dioxide may be utilized, oxygen is the most commonly used oxidant. Conventionally, BPSG is deposited by CVD at a temperature of from about 410° to about 450° C., most commonly at from about 425° to 430° C.

I have found that lowering the temperature of the deposition process improves the rate of deposition by 50 or more percent. This is considered unexpected since CVD deposition is a chemical reaction phenomenon rather than condensation of a vapor. Therefore, lowering the temperature might be expected to slow the reaction and, as a consequence, the deposition rate. In particular, BPSG is deposited by chemical vapor deposition (CVD) in accordance with this invention at from about 360° to 390° C., preferably from about 365° to 375° C. A most preferred deposition temperature is 370° C. The terminology "chemical vapor deposition" as utilized herein is atmospheric-pressure CVD and does not include processes wherein a plasma is utilized to enhance deposition.

A second improvement provided in accordance with this invention concerns the presence of particles in BPSG layers formed by conventional processes. These particles, which may vary in composition but are predominately $SiO_x$, are believed to result from homogeneous gas phase nucleation reactions. These particles contaminate the BPSG layer and deposit on the walls of the deposition chamber. The deposition of such particles on the walls of the deposition chamber is a significant problem because such deposits are a source of contamination for subsequent depositions. Therefore, the deposition apparatus must be frequently cleaned with loss of operating time.

I have found that increasing the oxygen content in the oxygen/hydride mixture significantly reduces the formation of contaminant particles, both in the BPSG layer and on the walls of the deposition chamber. In accordance with this invention, the oxygen content of the deposition mixture is increased from a conventional 20:1 ratio by volume of oxygen to the total of all hydrides, i.e. silane, phosphine and diborane, to between about 30:1 and 60:1, preferably about 40:1. The greater oxygen ratios, in general, produce a modest inhibitory effect on the deposition rate. However, this is more than offset by the significant increase in deposition rate realized in accordance with this invention.

Decreasing the deposition temperature in accordance with this invention also markedly reduces the particle contamination of the subject layers. Therefore, both process modifications contemplated herein act to reduce particle contamination and produce a BPSG layer of high purity and quality. Particularly suitable conditions for CVD deposition of a BPSG layer in accordance with this invention are a deposition temperature of about 370° C. and a volume ratio of oxygen to total hydrides of 40:1 to 60:1.

BPSG, as contemplated herein, will suitably contain from about 3 to about 6, preferably from about 4 to about 5, weight percent of boron and from about 2 to about 6, preferably from about 3 to about 5, weight percent of phosphorus. Preferred glasses are Type A which contains about 4 to 4.5 weight percent of boron and about 3.5 by 4 weight percent of phosphorus, and Type B which contains about 4.5 to 5 weight percent of boron and about 4 to 4.5 weight percent of phosphorus. The improvements in deposition rate and film quality obtained by the subject process apply to all such BPSG compositions.

The advantages of the improved process of this invention are a significantly improved deposition rate for BPSG layers. The layers formed have excellent uniformity and purity. Further, the films are produced at lower cost due to more efficient utilization of source gases and increased periods of productivity between cleaning and maintenance of equipment. The subject method is also advantageous in that it is not necessarily limited to a particular deposition apparatus.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

Three-inch silicon wafers were utilized as substrates. A layer of BPSG was deposited over groups of 12 substrates by chemical vapor deposition in an AMS-2100 reactor by Applied Materials Inc. to a thickness of about 8000 angstroms. The BPSG was Type B which contained about 4.5 percent of boron and about 4 percent of phosphorus.

Utilizing a deposition temperature of 430°, groups of 12 wafers were coated from deposition mixtures having a ratio of oxygen to total hydrides, i.e. silane, phosphine and diborane, of 20:1, 30:1 and 40:1, respectively. The BPSG layers were examined by laser particle scanning using a Hamamatsu Particle Counter to determine an average particle content. The films deposited from the 20:1 ratio had an average number of particles per wafer of 419. Those from the 30:1 mixture had an average number of particles per wafer of 348 and those from the 40:1 mixture had an average number of particles per wafer of 195. Ninety percent of the particles were between 0.3 and 2.0 micrometers in diameter and eighty percent were between 0.3 and 0.5 micrometer in diameter.

The significant improvement in particle contamination of the BPSG layer realized in accordance with this invention is clearly demonstrated by the above results.

EXAMPLE 2

Three-inch silicon wafers were coated with BPSG as in Example 1 in a RCA built bell jar rotary reactor. The BPSG was Type A which contained about 4 percent of boron and about 3.5 percent of phosphorus. Groups of three wafers were coated from mixtures having volume ratios of oxygen to total hydrides of 20:1, 30:1 and 60:1, respectively.

For each group of wafers, the rate of deposition of a layer of BPSG was measured at the conventional deposition temperature of 430° and at descending intervals of 20° or 30° to 330°. Plots of the deposition rates are shown in the FIGURE.

Referring to the FIGURE, it can be seen that increasing the oxygen content of the deposition mixture has a modest inhibitory effect on the deposition rate of the BPSG layer. It is demonstrated in Example 1, however, that a significantly more pure layer is obtained with higher oxygen content. The markedly increased deposition rates obtained in all ratios at lower temperatures are clearly demonstrated by the plots in the FIGURE.

EXAMPLE 3

Groups of wafers were coated with Type B BPSG in the apparatus of in Example 2. The volume ratio of oxygen to total hydrides in all depositions was 40:1. The average particle count per wafer was determined as in Example 2 for depositions beginning at 430° and descending by 10° intervals to 330°.

The average particle count at 430° was reduced by about 70 percent in the wafers coated at 370° and by about 75 percent for the wafers coated at 330°. These results demonstrate that the deposition temperatures contemplated herein also cause a substantial reduction in the particle content of BPSG layers and, therefore, improve their purity.

I claim:

1. In a method for forming a layer of borophosphosilicate glass on a suitable substrate by chemical vapor deposition of a mixture of oxygen and the hydrides of silicon, boron and phosphorus, the improvement wherein the deposition is carried out at a temperature of from about 365° to about 375° C., and the volume ratio of oxygen to the total of said hydrides is from about 40:1 to about 60:1.

2. A method in accordance with claim 1, wherein the deposition is carried out at about 370°.

3. A method in accordance with claim 1, wherein the volume ratio of oxygen to the total hydrides is about 40:1.

4. A method in accordance with claim 1, wherein the deposition is carried out at a temperature of about 370° C. and the volume ratio of oxygen to the total hydrides is about 40:1.

5. A method in accordance with claim 1, wherein the deposition is carried out at a temperature of about 370° C. and the volume ratio of oxygen to the total hydrides is about 60:1.

6. A method in accordance with claim 1, wherein the mixture also contains an inert diluent.

7. A method in accordance with claim 6, wherein said diluent is nitrogen.

* * * * *